(12) United States Patent
Chen et al.

(10) Patent No.: US 7,939,846 B2
(45) Date of Patent: May 10, 2011

(54) CIRCUIT BOARD FOR LED

(75) Inventors: Chin-Ching Chen, Taipei Hsien (TW); Cheng-Yi Chang, Taipei Hsien (TW); Ming-Kuei Lin, Taipei Hsien (TW)

(73) Assignee: Everlight Electronics Co., Ltd., Tucheng, Taipei Hsien (TW)

( * ) Notice: Subject to any disclaimer, the term of this patent is extended or adjusted under 35 U.S.C. 154(b) by 0 days.

(21) Appl. No.: 12/404,350

(22) Filed: Mar. 16, 2009

(65) Prior Publication Data
US 2010/0123157 A1    May 20, 2010

(30) Foreign Application Priority Data
Nov. 17, 2008    (TW) .............................. 97144357 A

(51) Int. Cl.
*H01L 33/00*    (2010.01)
(52) U.S. Cl. .......... 257/99; 257/693; 257/676; 257/690; 257/E33.066
(58) Field of Classification Search ............... 257/99, 257/693, 676, 690, E33.066
See application file for complete search history.

(56) References Cited

U.S. PATENT DOCUMENTS

| | | |
|---|---|---|
| 6,534,799 B1 | 3/2003 | Wang |
| 6,710,377 B2 | 3/2004 | Shimomura |
| 7,176,623 B2 | 2/2007 | Nitta et al. |
| 7,242,032 B2 | 7/2007 | Oshio |
| 2001/0024087 A1 | 9/2001 | Suehiro et al. |
| 2004/0046494 A1 | 3/2004 | Lai |
| 2007/0096129 A1 | 5/2007 | Park |

FOREIGN PATENT DOCUMENTS

| | | |
|---|---|---|
| CN | 1485929 A | 3/2004 |
| JP | 5429653 | 2/1979 |
| JP | 57162670 | 10/1982 |
| JP | 1146376 | 6/1989 |
| JP | 1154804 | 6/1989 |
| JP | 5021458 | 1/1993 |
| JP | 10256610 | 9/1998 |
| JP | 10261821 | 9/1998 |
| JP | 2001057447 | 2/2001 |
| JP | 2001077433 | 3/2001 |

*Primary Examiner* — Long Pham
(74) *Attorney, Agent, or Firm* — Winston Hsu; Scott Margo

(57) ABSTRACT

An LED is bonded to a circuit board. The circuit board comprises a chip mounting area, a bonding pad, and a connecting portion. The LED is mounted on the chip mounting area with an adhesive, and the bonding pad is connected with an electrode of the LED. Moreover, the connecting portion is positioned between the chip mounting area and the bonding pad. One side of the connecting portion is connected with the chip mounting area and another side is connected with the bonding pad. With a hollow portion of the connecting portion, the adhesive will be prevented from flowing to the bonding pad.

19 Claims, 4 Drawing Sheets

CIRCUIT BOARD FOR LED

BACKGROUND OF THE INVENTION

1. Field of the Invention

The present invention relates to a circuit board, and, particularly, to a circuit board for LED (light emitting diode).

2. Description of the Prior Art

The LED package mainly includes processes such as chip mounting, wire bonding, glue molding, cutting, test, and packing. The LED is allowed to be integrated with other electric circuit, as well as supported and protected.

In the chip mounting process, the LED will be fixed on the circuit board. Generally, an insulating adhesive is used for bonding the LED, as shown in FIG. 1. FIG. 1 shows a wiring diagram of a conventional circuit board for LED. Referring to FIG. 1, a circuit board 10 for LED has a chip mounting area 11 and a wire bonding area 13. The chip mounting area 11 is coated with an insulating adhesive to bond an LED 15 onto the chip mounting area 11. Thereafter, one electrode of the LED is electrically connected with the wire bonding area through a wire by bonding. However, the adhesive tends to flow along the shape of the wire bonding area and to the location for bonding the wire on the wire bonding area, due to the low viscosity of the adhesive. As a result, the wire can not electrically connect the electrode of the LED and the wire bonding area 13 having the insulating adhesive thereon according to a predetermined design. Such situation will lead to a poor reliability for the packaging process.

FIG. 2 shows a wiring diagram of another conventional circuit board for LED. Referring to FIG. 2, the circuit board 20 for LED has a chip mounting area 21, wire bonding areas 22 and 23, and four through holes 26, 27, 28, and 29. An LED 25 is electrically connected by bonding to the wire bonding areas 22 and 23 through a wire. The wire bonding area 22 connects the through holes 26 and 27 and the wire bonding area 23 connects the through holes 28 and 29, to allow two electrodes of the LED 25 to be electrically connected with the internal circuit of the circuit board 20. However, with such wiring scheme, the through holes occupy most area of the circuit board 20, and accordingly the amount of the LEDs 25 mounted on the circuit board 20 is limited.

Therefore, an improved circuit board for LED is needed to solve the aforesaid problems, such as adhesive overflow and excessive area occupied by the through holes on the circuit board for LED.

SUMMARY OF THE INVENTION

One object of the present invention is to provide a circuit board for LED to solve the problem of adhesive overflow and to increase the adhesion between the circuit board and the encapsulating material, such that the reliability of the packaging process can be increased.

Another object of the present invention is to provide a circuit board for LED, to increase the amount of LEDs mounted on a single circuit board.

According to the aforesaid object of the present invention, a circuit board for LED is provided, which includes a chip mounting area, a first bonding pad, and a connecting portion. The LED is mounted on the chip mounting area through an adhesive applied on the chip mounting area. The first bonding pad is electrically connected to an electrode of the LED. The connecting portion is disposed between the chip mounting area and the first bonding pad. One side of the connecting portion is connected with the chip mounting area, and another side of the connecting portion is connected with the first bonding pad. The connecting portion has a hollow portion which can prevent the adhesive from flowing to the first bonding pad.

Furthermore, in one preferred embodiment of the present invention, the hollow portion may be selectively disposed in an edge portion of the connecting portion or in a central region of the connecting portion.

In addition, in one preferred embodiment of the present invention, the circuit board for LED may further include a second bonding pad and at least two through holes. The second bonding pad is electrically connected to another electrode of the LED. The first bonding pad and the second bonding pad are electrically connected to an internal circuit layer of the circuit board for LED through the through holes respectively.

According to another object of the present invention, a circuit board for LED is provided. At least two LEDs are mounted on the circuit board for LED. The circuit board for LED includes at least two chip mounting areas, at least two first bonding pads, at least two connecting portions, and at least two through holes. The at least two LEDs are mounted on the at least two chip mounting areas, respectively, through an adhesive applied on the chip mounting areas. Each first bonding pad is electrically connected to an electrode of each of the LEDs. The bonding pads are electrically connected to an internal circuit layer of the circuit board for LED through the through holes. Each of the connecting portions is disposed between each of the chip mounting areas and each of the first bonding pads. One side of each of the connecting portions is connected with each of the chip mounting areas, and another side of each of the connecting portions is connected with each of the first bonding pads. Each of the connecting portions has a hollow portion which prevents the adhesive from flowing to the bonding pad.

In another aspect, in another preferred embodiment according to the present invention, the circuit board for LED may further includes at least two second bonding pads. Each second bonding pad is electrically connected to another electrode of each LED. The second bonding pads are electrically connected to the internal circuit layer of the circuit board for LED through the through holes.

In view of the above description, by utilizing the circuit board for LED according to the present invention, the adhesive overflow to the bonding pads can be prevented, the amount of the LEDs mounted on one single circuit board can be increased, and the adhesion between the circuit board and the encapsulating material can be enhanced, such that the improvement of the reliability of the packaging process and the increase of the production capacity can be accomplished by the circuit board for LED of the present invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3b illustrates a cross-sectional view of the circuit board for LED along the line AA' in FIG. 3a;

DETAILED DESCRIPTION

Figure 1:
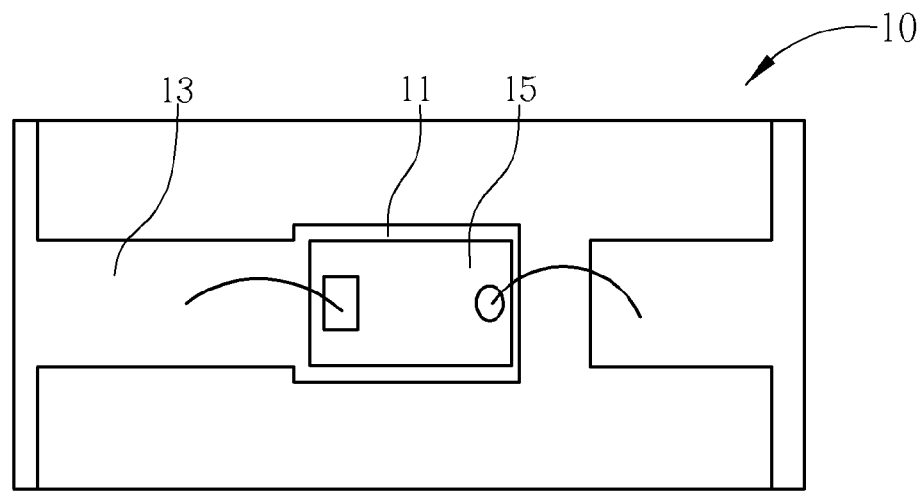
FIG. 1 shows a wiring diagram of a conventional circuit board for LED.
Figure 2:
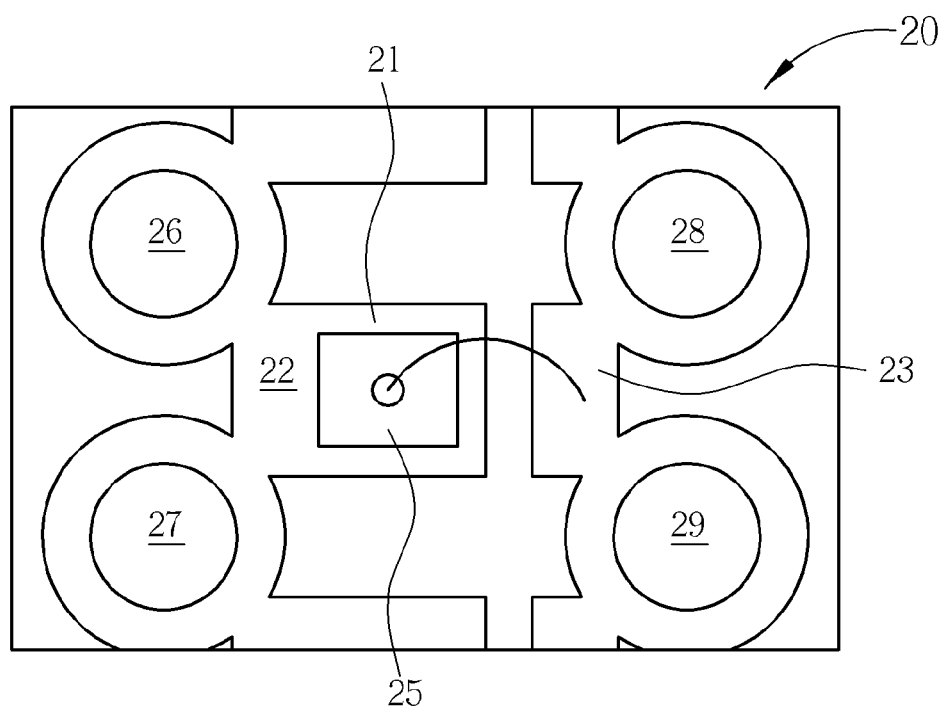
FIG. 2 shows a wiring diagram of another conventional circuit board for LED.
Figure 3A:
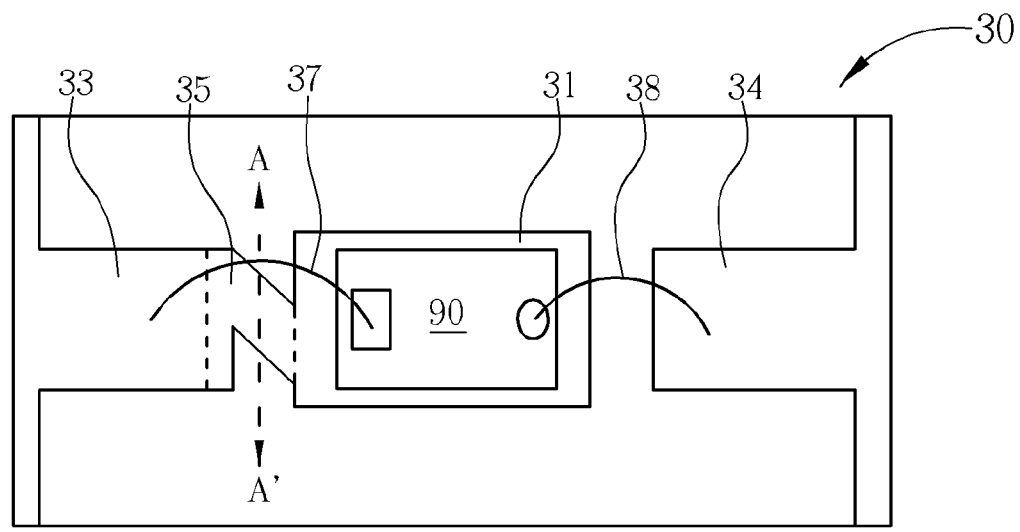
FIG. 3a illustrates a wiring diagram of a preferred embodiment of the circuit board for LED according to the present invention.

FIG. 3a illustrates a wiring diagram of one preferred embodiment of the circuit board for LED according to the present invention. Referring to FIG. 3a, in this preferred embodiment, an LED 90 is mounted on the circuit board 30 for LED. The circuit board 30 for LED includes a chip mounting area 31, bonding pads 33 and 34, and a connecting portion 35. In the chip mounting process for packaging the LED 90, the surface of the chip mounting area 31 will be coated with an insulating adhesive for mounting the LED 90. In a subsequent wire bonding process, one end of a wire 37 is connected by bonding to, for example, a negative electrode of the LED 90, and another end of the wire 37 is connected by bonding to the bonding pad 33, to allow the negative electrode of the LED 90 to be electrically connected to the bonding pad 33. On the other hand, one end of a wire 38 is connected by bonding to a positive electrode of LED 90, and another end of the wire 38 is connected by bonding to the bonding pad 34, to allow the positive electrode of the LED 90 to be electrically connected to the bonding pad 34. The connecting portion 35 electrically connects the chip mounting area 31 and the bonding pad 33. Two triangular hollow portions are located on edges of the connecting portion 35, respectively. Since the two triangular hollow portions each are in a trench shape, as the insulating adhesive flows toward the bonding pad 33, the insulating adhesive will stay in the triangular hollow portions and not flow onto the bonding pad 33. Accordingly, the situation that the insulating adhesive impedes the wire bonding can be effectively avoided.

In addition, in the subsequent mold compression, the triangular hollow portion of the connecting portion 35 may increase the contact area between the encapsulating material and the circuit board 30 for LED, such that the adhesion between the circuit board 30 for LED and the encapsulating material can be enhanced.

Therefore, the circuit board 30 for LED of the preferred embodiment can effectively prevent the overflow of the insulation adhesive and improve the reliability of the packaging process.

Figure 3B:
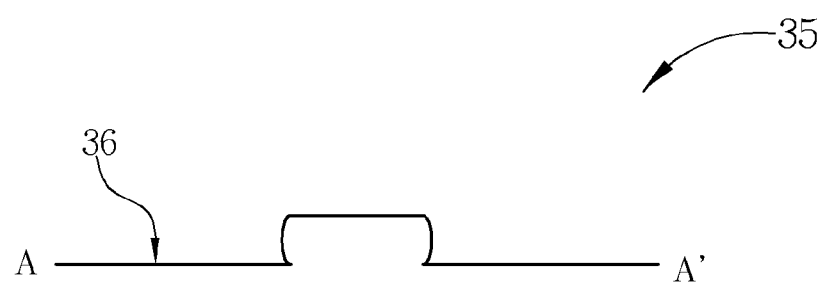

FIG. 3b illustrates a cross-sectional view of the circuit board for LED along the line AA' in FIG. 3a. Referring to FIGS. 3a and 3b, the triangular hollow portion 36 of the connecting portion 35 is in a trench shape. Accordingly, when the insulating adhesive flows toward the bonding pad 33, the insulating adhesive will stop flowing and stay in the triangular hollow portion 36 and not flow onto the bonding pad 33, such that the situation that the insulating adhesive impedes the wire bonding can be effectively avoided.

Figure 4:
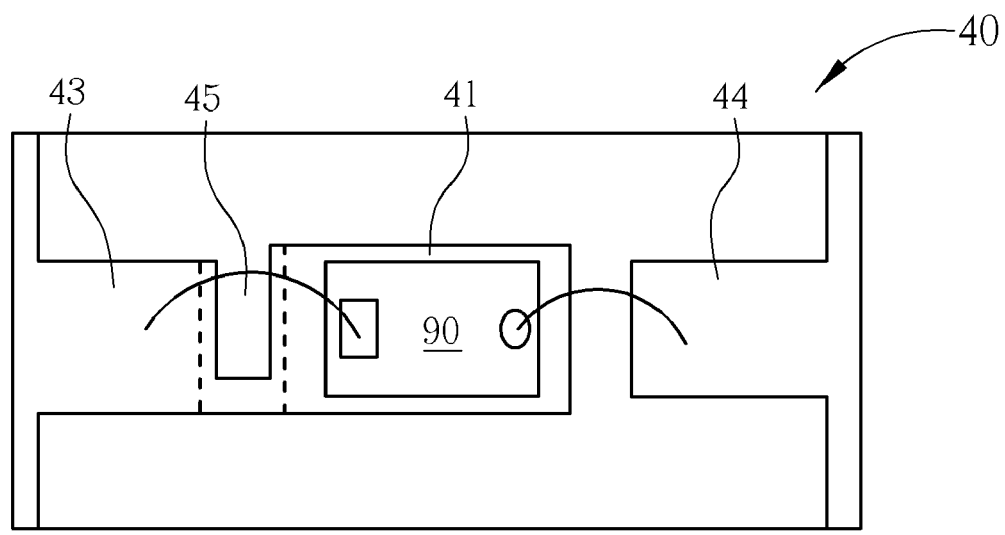
FIG. 4 illustrates a wiring diagram of another preferred embodiment of the circuit board for LED according to the present invention.

FIG. 4 illustrates a wiring diagram of another preferred embodiment of the circuit board for LED according to the present invention. Referring to FIG. 4, an LED 90 is mounted on the circuit board 40. The circuit board 40 for LED includes a chip mounting area 41, bonding pads 43 and 44, and a connecting portion 45. The circuit board 40 for LED differs from the circuit board 30 for LED in that the connecting portion 45 has a trench-shaped hollow portion in the edge region thereof. The hollow portion is in a trench shape, and the insulation adhesive will stop flowing and stay in this hollow portion and not flow onto the bonding pad 43.

Figure 5:
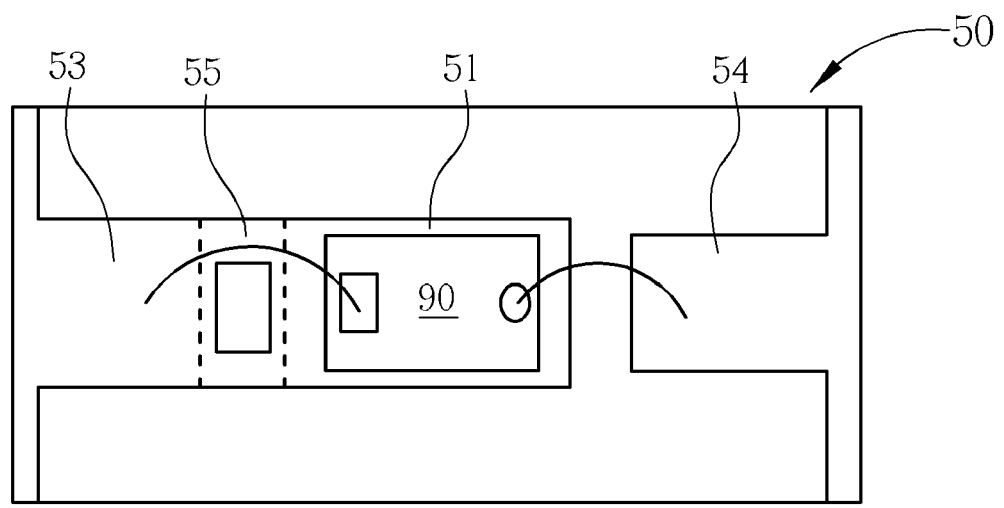
FIG. 5 illustrates a wiring diagram of still another preferred embodiment of the circuit board for LED according to the present invention.

FIG. 5 illustrates a wiring diagram of still another preferred embodiment of the circuit board for LED according to the present invention. Referring to FIG. 5, an LED 90 is mounted on the circuit board 50 for LED. The circuit board 50 for LED includes a chip mounting area 51, bonding pads 53 and 54, and a connecting portion 55. The circuit board 50 for LED differs from the circuit board 30 for LED in that the connecting portion 55 has a rectangular hollow portion located in the center region thereof. The rectangular hollow portion is in a trench shape, and the insulation adhesive will stop flowing and stay in this rectangular hollow portion and not flow onto the bonding pad 53.

Figure 6:
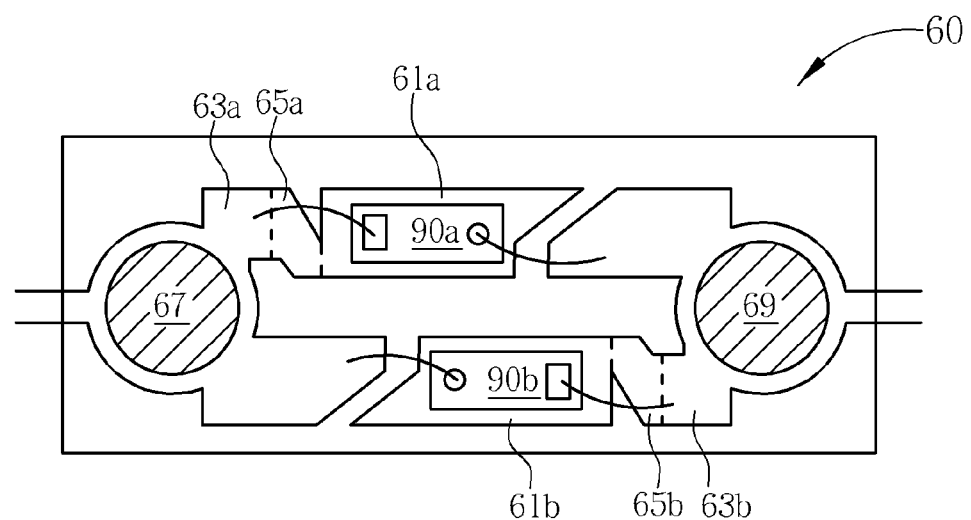
FIG. 6 illustrates a wiring diagram of further another preferred embodiment of the circuit board for LED according to the present invention.

FIG. 6 illustrates a wiring diagram of further another preferred embodiment of the circuit board for LED according to the present invention. Referring to FIG. 6, in this preferred embodiment, LEDs 90a and 90b are mounted on the circuit board 60 for LED. The circuit board 60 for LED includes chip mounting areas 61a and 61b, bonding pads 63a and 63b, connecting portions 65a and 65b, and through holes 67 and 69. Likewise, in the chip mounting process for packaging the LEDs 90a and 90b, the surface of the chip mounting areas 61a and 61b will be coated with an insulating adhesive for mounting the LEDs 90a and 90b, respectively. In a subsequent wire bonding process, one end of a wire is bonded to an electrode of the LED 90a, and the other end of the wire is bonded to the bonding pad 63a. One end of another wire is bonded to an electrode of the LED 90b, and the other end of the wire is bonded by to the bonding pad 63b. Thus, the negative electrodes of the LEDs 90a and 90b are allowed to be electrically connected to the bonding pads 63a and 63b, respectively. In addition, the bonding pads 63a and 63b are electrically connected to an internal circuit layer of the circuit board 60 for LED through the through holes 67 and 69, respectively. The connecting portions 65a and 65b electrically connect with the chip mounting areas 61a and 61b and the bonding pads 63a and 63b, respectively. Each of the connecting portions 65a and 65b has a triangular hollow portion in an edge region thereof. Since the two triangular hollow portions each are in a trench shape, as the insulating adhesive flows toward the bonding pad 63a or 63b, the insulating adhesive will stay in the triangular hollow portions and not flow onto the bonding pads 63a and 63b. Accordingly, the situation that the insulating adhesive impedes the wire bonding by soldering can be effectively avoided.

In a packaging process, using the circuit board 60 for LED can effectively prevent the insulating adhesive from impeding the wire bonding, and in the other hand, since the LEDs 90a and 90b commonly use the through holes 67 and 69, the area occupied by the through holes 67 and 69 on the circuit board 60 for LED can be reduced, such that the amount of LEDs disposed on the circuit board 60 for LED can be increased. Furthermore, the area occupied by the through holes 67 and 69 may be further effectively reduced through the utilization of advanced laser technology to form the through holes 67 and 69 with decreased diameters in the embodiment of the present invention.

Figure 7:
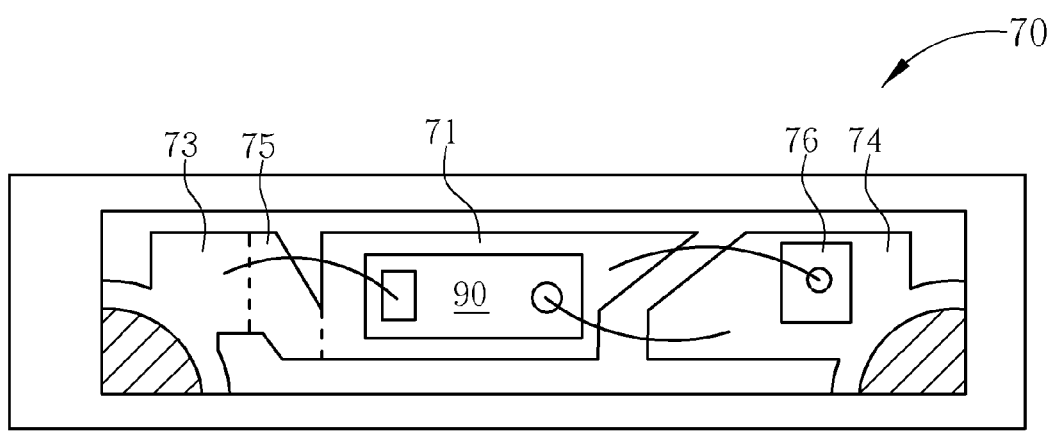
FIG. 7 illustrates a wiring diagram of yet another preferred embodiment of the circuit board for LED according to the present invention.

The circuit board 60 for LED is cut into two pieces of circuit boards 70 (as shown in FIG. 7) in a cutting process for subsequent package tests.

FIG. 7 illustrates a wiring diagram of yet another preferred embodiment of the circuit board for LED according to the present invention. Referring to FIG. 7, the LED 90 is bonded to the circuit board 70 for LED, which includes a chip mounting area 71, bonding pads 73 and 74, and a connecting portion 75. In addition, an element 76 for voltage regulator may be optionally disposed on the circuit board 70 for LED for connecting with a voltage regulator to reduce electromagnetic interference.

The connecting portions 65a and 65b, and 75 of the circuit boards 60, 70 for LED each may have a triangular hollow portion as the aforesaid or may optionally have a trench-shaped hollow portion in an edge region of the connecting portion or a hollow portion in the central region of the connecting portion. However, it should be noted that the structures of the connecting 65a and 65b are not limited to the structures mentioned in the aforesaid embodiments. Those ordinarily skilled in the art may change the shape and the location of the hollow portion of the connecting portion without departing from the spirit and the scope of the present invention.

In view of the above-described preferred embodiments of the present invention, it is advantageous to utilize the circuit board for LED according to the present invention that the adhesive overflow can be prevented, the amount of the LEDs mounted on one single circuit board can be increased, the adhesion of the circuit board between the encapsulating material can be enhanced, the reliability of the packaging process can be improved, and the production capacity can be increased.

Those skilled in the art will readily observe that numerous modifications and alterations of the device and method may be made while retaining the teachings of the invention.

What is claimed is:

1. A circuit board for LED, on which an LED is mounted, comprising:
   a chip mounting area on which the LED is mounted through an adhesive applied on the chip mounting area;
   a first bonding pad electrically connected to an electrode of the LED; and
   a connecting portion having a first hollow portion and disposed between the chip mounting area and the first bonding pad, wherein the connecting portion electrically connects the chip mounting area and the first bonding pad, one side of the connecting portion is connected with the chip mounting area, another side of the connecting portion is connected with the first bonding pad, and the first hollow portion is located between the chip mounting area and the first bonding pad, wherein the first hollow portion is located in a central region of the connecting portion,
   wherein the adhesive is prevented from flowing to the first bonding pad by the first hollow portion.

2. The circuit board for LED of claim 1, further comprising a second bonding pad and at least two through holes, wherein the second bonding pad is electrically connected to another electrode of the LED, and the first bonding pad and the second bonding pad are electrically connected with an internal circuit layer of the circuit board through the through holes respectively.

3. The circuit board for LED of claim 2, wherein the connecting portion further has a second hollow portion located in an edge region of the connecting portion.

4. The circuit board for LED of claim 1, wherein the connecting portion further has a second hollow portion located in an edge region of the connecting portion.

5. The circuit board for LED of claim 1, wherein the adhesive is an insulating adhesive.

6. The circuit board for LED of claim 1, wherein the first hollow portion is a rectangular hollow portion.

7. The circuit board for LED of claim 2, wherein the first hollow portion is a rectangular hollow portion.

8. The circuit board for LED of claim 3, wherein the second hollow portion is a triangular hollow portion.

9. The circuit board for LED of claim 4, wherein the second hollow portion is a triangular hollow portion.

10. The circuit board for LED of claim 3, wherein the second hollow portion is a rectangular hollow portion.

11. The circuit board for LED of claim 4, wherein the second hollow portion is a rectangular hollow portion.

12. An LED package, comprising:
    an LED; and
    a circuit board comprising:
        a chip mounting area on which the LED is mounted through an adhesive applied on the chip mounting area;
        a first bonding pad electrically connected to an electrode of the LED; and
        a connecting portion having a first hollow portion and disposed between the chip mounting area and the first bonding pad, wherein the connecting portion electrically connects the chip mounting area and the first bonding pad, one side of the connecting portion is connected with the chip mounting area, another side of the connecting portion is connected with the first bonding pad, and the first hollow portion is located between the chip mounting area and the first bonding pad, wherein the first hollow portion is located in a central region of the connecting portion.

13. The LED package of claim 12, wherein the circuit board further comprises a second bonding pad and at least two through holes, wherein the second bonding pad is electrically connected to another electrode of the LED, and the first bonding pad and the second bonding pad are electrically connected with an internal circuit layer of the circuit board through the through holes respectively.

14. The LED package of claim 13, wherein the connecting portion further has a second hollow portion located in an edge region of the connecting portion.

15. The LED package of claim 12, wherein the connecting portion further has a second hollow portion located in an edge region of the connecting portion.

16. The LED package of claim 12, wherein the first hollow portion is a rectangular hollow portion.

17. The LED package of claim 13, wherein the first hollow portion is a rectangular hollow portion.

18. The LED package of claim 14, wherein the second hollow portion is a triangular hollow portion or a rectangular hollow portion.

19. The LED package of claim 15, wherein the second hollow portion is a triangular hollow portion or a rectangular hollow portion.

* * * * *